United States Patent [19]
Ando et al.

[11] Patent Number: 6,092,485
[45] Date of Patent: Jul. 25, 2000

[54] APPARATUS AND METHOD FOR PROCESSING SUBSTRATE

[75] Inventors: Yasunori Ando; Masatoshi Onoda, both of Kyoto, Japan

[73] Assignee: Nissin Electric Co., Ltd., Kyoto, Japan

[21] Appl. No.: 08/959,521

[22] Filed: Oct. 28, 1997

[30] Foreign Application Priority Data

Oct. 29, 1996 [JP] Japan ................................. 8-303805

[51] Int. Cl.$^7$ .......................... B65G 49/07; H01L 21/68
[52] U.S. Cl. ................. 118/723 VE; 118/723 FI; 156/345 P; 156/345 PC; 156/345 WH; 204/298.25; 204/298.28
[58] Field of Search ................ 118/723 VE, 723 FL; 156/345 P, 345 PC, 345 WH; 204/298.25, 298.28

[56] References Cited

U.S. PATENT DOCUMENTS

| | | | |
|---|---|---|---|
| 3,717,119 | 2/1973 | Boys | 118/723 |
| 4,816,638 | 3/1989 | Ukai et al. | 219/121.43 |

FOREIGN PATENT DOCUMENTS

| | | |
|---|---|---|
| 01301870 | 6/1989 | European Pat. Off. . |
| 07221163 | 4/1994 | European Pat. Off. . |
| 0690480A1 | 1/1996 | European Pat. Off. . |
| 2198881A | 6/1988 | United Kingdom . |
| WO97/30470 | 8/1997 | WIPO . |

*Primary Examiner*—Nasser Ahmad
*Attorney, Agent, or Firm*—Finnegan, Henderson, Farabow, Garrett & Dunner, L.L.P.

[57] ABSTRACT

A substrate processing apparatus includes a processing chamber and a vacuum spare chamber adjacent thereto through a vacuum valve. The processing chamber houses two holders for holding substrates on their surfaces on the same side. The processing chamber is provided with an ion source for irradiating the substrate on each holder having reached a processing position P with an ion beam so that it is subjected to ion implantation. The processing chamber is internally provided with a holder moving mechanism for performing the operation of moving the two holders in parallel independently from each other so that they traverse the processing position P, and moving the two holders in parallel simultaneously between the insides of the processing chamber and vacuum spare chamber through the vacuum valve. The vacuum spare chamber is internally provided with a substrate replacing mechanism for replacing processed substrates and non-processed substrates with each other collectively for the two holders in cooperation with the holder moving mechanism.

8 Claims, 8 Drawing Sheets

APPARATUS AND METHOD FOR PROCESSING SUBSTRATE

BACKGROUND OF THE INVENTION

1. Field of the Invention

The present invention relates to a substrate processing apparatus and method for subjecting a substrate to processing such as ion-implantation, film deposition accompanied by ion-implantation and plasma processing, and more particularly to simplify an apparatus configuration and improving the throughput thereof.

2. Description of the Related Art

FIG. 10 is a plan view showing an exemplary conventional substrate processing apparatus. This substrate processing apparatus is an ion doping apparatus (ion implanter without mass separation referred to also in the following description) having a total of four vacuum chambers of a processing chamber 8, a transfer robot chamber 16 and two spare vacuum chambers 14. Reference numerals 20 to 22 denote vacuum valves.

The processing chamber 8 serves to a substrate (e.g. a substrate for liquid-crystal display or a semiconductor substrate referred to also in the following description). Within the processing chamber 8, a holder 4 for holding the substrate 2 is provided. An ion source 10 is attached to the wall thereof. The substrate 2 on the holder 4 is irradiated with ion beams 12 so that it is subjected to the processing such as ion implantation. The holder 4 is rotated between an upright condition for substrate processing and a horizontal condition for substrate replacement by a holder driving mechanism 6.

The transfer robot chamber 16 serves to house a transfer robot 18 for transferring the substrate 2 in vacuum. The transfer robot 18 is a robot equipped with two or three shafts, which has an arm 19 for placing the substrate 2 thereon to replace a processed substrate and a non-processed substrate with each other for the holder in the horizontal condition within the processing chamber 8 and transfer-out/in of the substrate 2 for both spare chambers 14.

Each spare vacuum chamber 14 serves to transfer the substrate 2 between an atmosphere and the environments of vacuum. In the air in front of the spare chamber 14, a three-shaft transfer robot 24 is provided to have an arm 25 to transfer the substrate 2 placed thereon in and out from each spare vacuum chamber 14.

An explanation will be given of the overall operation of the substrate processing apparatus. A non-processed substrate 2 is transferred into the processing chamber along a path indicated by arrow a–c in FIG. 10. The non-processed substrate 2 is irradiated with the ion beams 12 so that it is subjected to the processing such as ion implantation. The processed substrate 2 is transferred into the environment of air along the path indicated by arrow d–f. In this way, substrates 2 will be processed-one by one.

The substrate processing apparatus has four vessels (i.e., processing chamber 8, transfer robot chamber 16 and two spare chambers 14). In addition, these vacuum vessel must be evacuated respectively to vacuum. This makes the apparatus configuration complicate.

Further, the arm-type transfer robot 18 equipped with two or three shafts is used for substrate transfer in vacuum. Such a transfer robot 18 is complicate in configuration and expensive. This also makes the apparatus configuration complicate.

Using the spare vacuum chambers 14 (and the transfer robots 24 on the side of air) unified into a single spare chamber, the substrates before and after the processing can be loaded or unloaded in order one by one between the vacuum and air. However, such a configuration makes the time required for load/unload of the substrate 2 longer by the degree of reduction of one spare chamber 14, thereby attenuating the throughput (processing capability of the substrate 2 per unit time). In this case also, three vacuum vessels must be still provided.

If the number of vacuum vessels can be reduced into two of the processing chamber 8 and spare vacuum chamber 14, the apparatus configuration can be simplified remarkably.

However, because of such a simple configuration, the transfer robot 18 has to be housed within the spare chamber 14. In such a configuration, there-are disadvantages that (1) the transfer robot 18 occupies a fairly large volume so that the spare vacuum chamber 14 has to be formed to have a large volume, and that (2) the transfer robot 18 has a complicate structure to make it difficult the environment to be evacuated to vacuum. Because of these two causes, the evacuation speed in the auxiliary vacuum chamber 14 is reduced to lower the throughput of the apparatus. Further, reduction of the spare vacuum chambers into a single chamber lowers the throughput as described above. Accordingly, the throughput of the apparatus will be lowered fairly.

SUMMARY OF THE INVENTION

It is an object of the present invention to provide a substrate processing apparatus and method which can simplify the apparatus configuration and improve the throughput.

A substrate processing apparatus according to the present invention comprises a processing chamber evacuated to vacuum for processing substrates; a plurality of holders arranged substantially in parallel to one another within the processing chamber, each for holding a substrate on a surface thereof on the same side; a processing unit for successively processing the substrates held in the respective holders at a prescribed position in the processing chamber; a vacuum spare chamber provided adjacent to the processing chamber; a vacuum valve intervening between the vacuum spare chamber and the processing chamber to permit the plurality of holders holding the substrates to be passed collectively; a holder moving mechanism for performing the operation of the reciprocating linear movement of the plurality of holders independently from one another within the processing chamber so that the plurality of holders traverse the processing position, and the reciprocating linear movement of the plurality of holders simultaneously between the insides of the processing chamber and vacuum spare chamber through the vacuum valve; and a substrate replacing mechanism provided within the vacuum spare chamber capable of holding non-processed substrates and processed substrates whose number is equal to that of the holders, and serving to replace the processed substrates and non-processed substrates with each other collectively for the plurality of holders moved into the vacuum spare chamber in cooperation with the holder moving mechanism.

In accordance with the present invention, only two vacuum vessels are required and a mechanism for transferring a substrate is also simplified so that the apparatus arrangement can be simplified. In addition, the number of times of substrate transfer, substrate replacement and vacuum evacuation for the vacuum spare chamber can be reduced, and the volume of the vacuum spare chamber can be reduced to shorten the vacuum time so that the throughput of the apparatus can be improved.

A substrate processing method for processing substrates using the substrate processing apparatus according to the present invention comprises the steps of: reciprocating one of the plurality of holders each holding the substrate once over the processing position to process the substrate by the processing means; and during the reciprocating step, resting the remaining holders each holding the substrate at a stand-by position where the substrate is not processed; wherein the reciprocating step and resting step are subjected successively to the plurality of holders, and a series of the successive process to the plurality of holders are repeated at least one time.

In accordance with the substrate processing method according to the present invention, since a single sheet of substrate can be processed divisionally in at least two steps, the temperature increase of the substrate can be reduced as compared with the case where the substrate is subjected to a necessary quantity of processing in one step. Further, even if a change occurs in the processing device while the substrate is processed, the influence by the change can be decreased as compared with the case where the substrate is subjected to a necessary quantity of processing in one step so that attenuation of uniformness of the substrate processing can be relaxed.

DETAILED DESCRIPTION OF THE INVENTION

Figure 1:
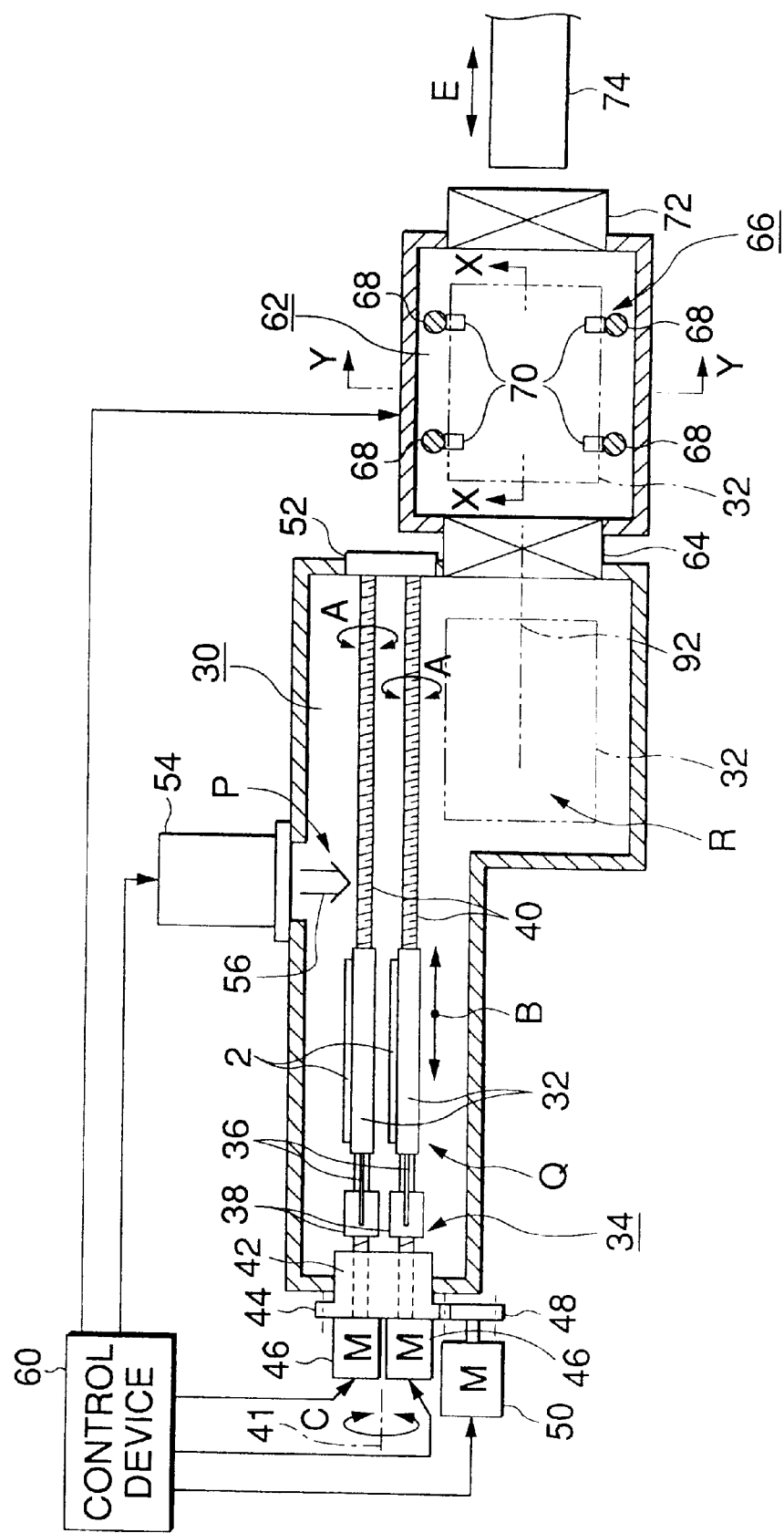
FIG. 1 is a cross sectional view showing an example of the substrate processing apparatus according to the present invention.

Detailed description of the invention will be described as follows.

A substrate processing apparatus according to the present invention has a processing chamber, a plurality of holders, a processing unit, a vacuum spare chamber, a vacuum valve, a holder moving mechanism, and a substrate replacing mechanism. A processing chamber is evacuated to vacuum for processing substrates. The plurality of holders is arranged substantially in parallel to one another within the processing chamber, which holds the substrates on their surfaces on the same side, respectively. The processing unit for successively processing the substrates held in the respective holders at a prescribed position in the processing chamber. The vacuum spare chamber is provided adjacent to the processing chamber. The vacuum valve intervenes between the vacuum spare chamber and the processing chamber to permit the plurality of holders holding the substrates to be passed collectively. The holder moving mechanism performs the operation of the reciprocating linear movement of said plurality of holders independently from one another other within the processing chamber so that they traverse the processing position, and the reciprocating linear movement of the plurality of holders collectively between the insides of the processing chamber and vacuum spare chamber though the vacuum valve. The substrate replacing mechanism is provided within the vacuum spare chamber capable of holding non-processed substrates and processed substrates whose number is equal to that of the holders, and serves to replace the processed substrates and non-processed substrates with each other collectively for the plurality of holders moved into said vacuum spare chamber, in cooperation with the holder moving mechanism.

The above configuration has only to include two vacuum vessels of the processing chamber and the vacuum spare chamber.

In addition, the holder moving mechanism permits the plurality of holders to make the reciprocating linear movement independent from one another so as to traverse the processing position within the processing chamber, thereby successively subjecting the substrate held in each holder to the processing. Further, the same holder moving mechanism permits the plurality of holders each holding the substrate to make the reciprocating linear movement between the insides of the processing chamber and the vacuum spare chamber, thereby transferring the substrates between both chambers. For this reason, unlike the conventional art, provision of the transfer robot dedicated to substrate transfer in the vacuum is not required, thus simplifying the mechanism of the substrate transfer in the vacuum.

Thus, only two vacuum vessels are required, and the mechanism of the substrate transfer in the vacuum is simplified, so that the apparatus configuration can be simplified.

Further, into the vacuum spare chamber, the plurality of holders each holding a substrate can be moved simultaneously by the holder moving mechanism. In the vacuum spare chamber, for the plurality of holders, the processed substrates and the non-processed substrates are collectively replaced with each other in cooperation of the holder moving mechanism and the substrate replacing mechanism. Therefore, as compared with the case where replacement between the processed substrates and non-processed substrates is carried out one by one as in the conventional art, the number of times of substrate transfer, substrate replacement and vacuum evacuation of the vacuum spare chamber can be reduced so that the throughput of the apparatus can be improved.

The substrate replacing mechanism serves to execute the substrate replacement in cooperation with the holder moving mechanism. Accordingly, the substrate replacing mechanism can be more simple and smaller than the transfer robot according to the conventional art. Thus, the volume of the vacuum spare chamber can be reduced, and because of its simple mechanism, the vacuum evacuation of the environment can be easily done. Accordingly, the vacuum evacuation time of the vacuum spare chamber can be shortened. For this reason also, the throughput of the apparatus can be improved.

Embodiments of the present invention will be described as follows in detail referring to the accompanying drawings.

Figure 2:
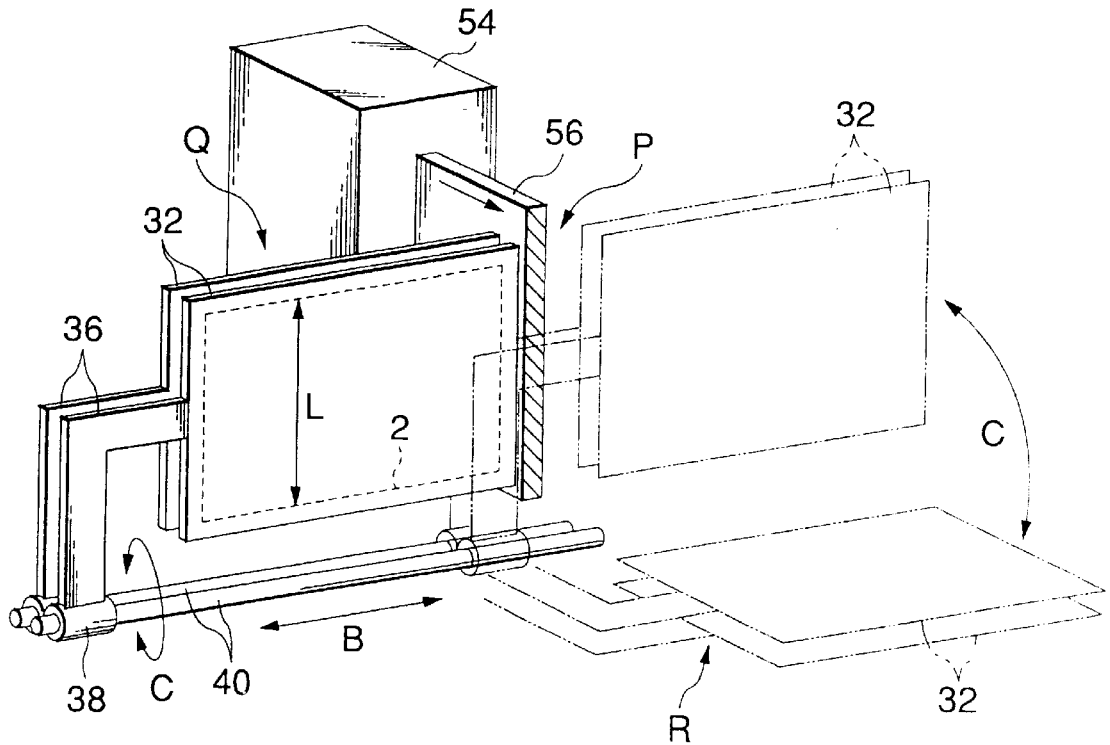
FIG. 2 is a perspective view partially showing the neighborhood of an ion source in the substrate processing apparatus in FIG. 1.
Figure 3:
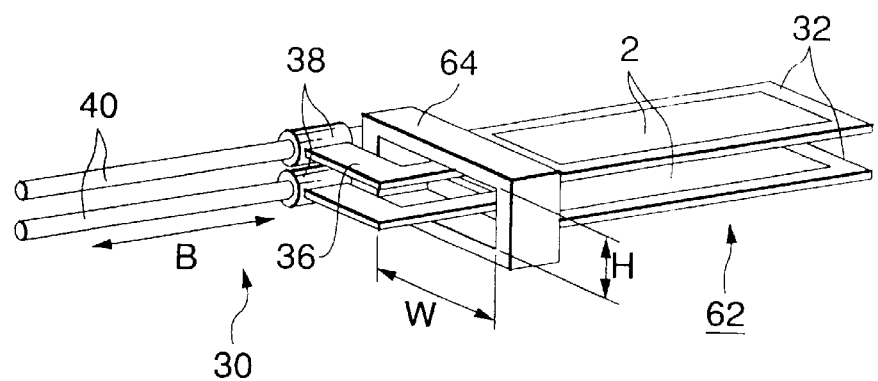
FIG. 3 is a perspective view partially showing the neighborhood of a vacuum valve of the substrate processing apparatus shown in FIG. 1.
Figure 4:
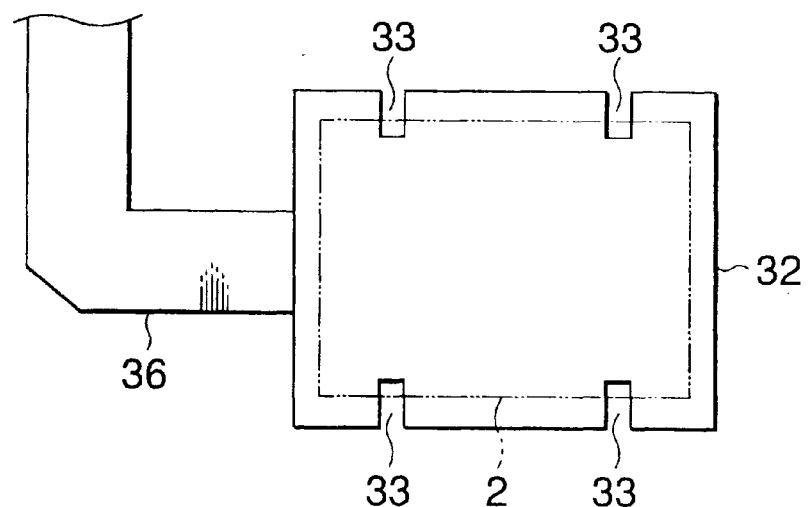
FIG. 4 is a plan view showing an example of the holder in FIG. 1.

FIG. 1 is a cross sectional view of an embodiment of the substrate processing apparatus according to the present invention. FIG. 2 is a perspective view partially showing the portion around an ion source of the substrate processing apparatus shown in FIG. 1. FIG. 3 is a perspective view partially showing the neighborhood a vacuum valve of the substrate processing apparatus shown in FIG. 1. FIG. 4 is a plan view showing an example of the holder in FIG. 1.

The substrate processing apparatus is an ion doping apparatus having a total of two vacuum vessels of a processing chamber 30 and an spare chamber 62 adjacent to it.

The processing chamber 30 serves to process the substrate 2, and is evacuated to vacuum e.g. $10^{-6}$ to $10^{-7}$ Torr by a vacuum pump not shown.

The spare vacuum chamber 62 serves to load/unload the substrate 2 between the processing chamber 30 and air without getting the processing chamber 30 back to the air pressure. The spare vacuum chamber 62 is evacuated to vacuum e.g. $10^{-2}$ to $10^{-3}$ Torr by a vacuum pump not shown.

The processing chamber 30 and the vacuum spare chamber is separated from each other by a vacuum valve (e.g. gate valve) 64. In this embodiment, as shown in FIG. 3, the vacuum valve 64 is arranged so as to be lengthy in a horizontal direction, and has a width W and height H which permit two holders 32 holding the substrates 2, respectively to be simultaneously passed in a substantially horizontal status.

The vacuum spare chamber 62 and the air are separated from each other by a vacuum valve (e.g. flap valve) 72. Ahead of the air side of the vacuum valve 72, a two or three transfer robot (not shown) is provided which has an arm 74 and can load/unload the substrate 2 placed thereon between the vacuum spare chamber 62 and the air as indicated by an arrow E. This transfer robot may be the same as the transfer robot 24 shown in FIG. 10.

The processing chamber 30 houses two holders 32 holding the substrates 2 as described above on the surfaces on the same side (surface on the side of the ion source 54). Both holders 32 are supported substantially in parallel to each other by a holder moving mechanism 34. Each holder 32 has a known holder (not shown) such as a ring-shaped damper or plural dampers which holds down the periphery of the substrate 2.

The substrate 2 may be e.g. a glass substrate for liquid crystal display and has a size of e.g. 550×650 mm or so. Each holder 32 has a surface size by 10 to 20 mm in both long and wide dimensions than that of the substrate at issue.

An ion source 54 as an example of the processing unit is attached on the wall at the central point of the processing chamber 30. At the processing position P ahead of the wall, the ion source 54 sequentially irradiates the substrate 2 held by each holder 32 with an ion beam 56 so that the substrate 2 is subjected to the ion implantation processing. In this embodiment, the ion source 54, as shown in FIG. 2, emits a band-like ion beam which is lengthy in a direction (i.e., vertical direction in this example) substantially vertical to the moving direction of the holder 32 indicated by arrow B and longer than the length L of the substrate 2 in the above vertical direction.

At the section extending from the inside of the processing chamber 30 to the outside thereof, a holder moving mechanism 34 is provided. Within the processing chamber 30, the holder moving mechanism 34 has ball screws 40 arranged in parallel to a line 92 connecting the processing chamber 30, vacuum tube 64 and vacuum spare chamber 62 and in parallel to each other. Both ends of the ball screws are rotatably supported by supporting sections 42 and 52. In this embodiment, as indicated by arrow C, both supporting sections 42 and 52 themselves are rotatable for the wall surface of the processing chamber about the central axis between both ball screws 40. Their rotating areas are vacuum-sealed by packing (not shown) such as an O-ring. The section where the ball screws 40 pass through the supporting section 42 is also vacuum-sealed by a packing (not shown) such as an O-ring.

As described above, in order to change the profile of each holder 32 between its upright condition and horizontal condition, in this embodiment, the processing chamber 30 has a shape which is lengthy in a vertical direction in the region between a stand-by position and a processing position and is approximate to a ¼ cylinder so as to permit its rotation in the range of a holder rotating position R. The vacuum spare chamber 62 has a shape which is wide in a horizontal direction and low in a vertical direction to receive the holders 32 in a horizontal condition.

Figure 6:
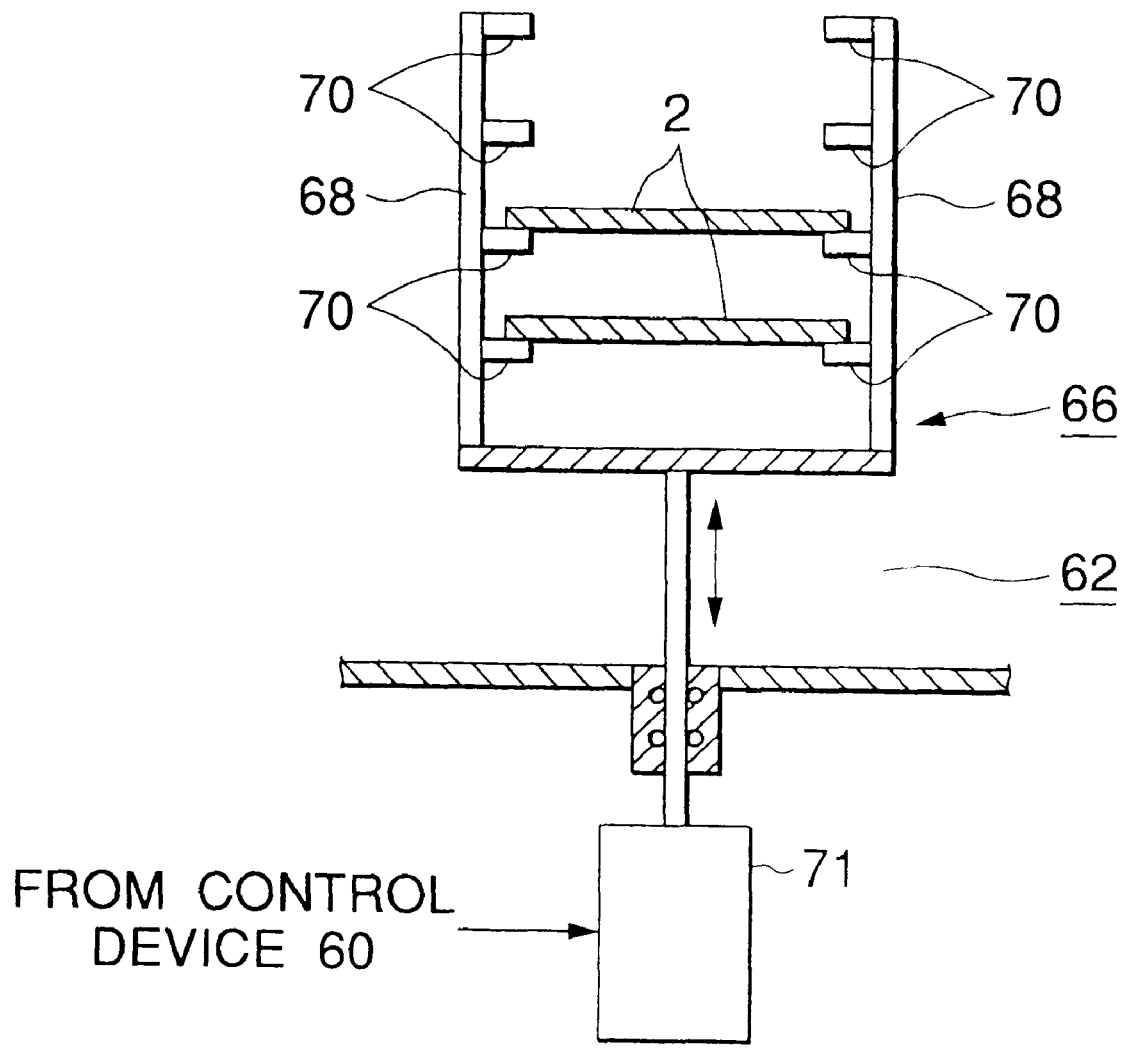
FIG. 6 is a view taken along line Y—Y in the substrate replacing mechanism in FIG. 1.

Within the vacuum spare chamber 62, a substrate replacing mechanism 66 is provided. This substrate replacing mechanism 66 is concretely a substrate ascent/descent mechanism. As seen from FIGS. 1, 6 and 7, the substrate ascent/descent mechanism has four columns 68, four-stage supporting pins 70 which protrude inside each of the poles to support the periphery of each substrate 2 and a driving mechanism 71 (FIG. 6) which ascend/descend the poles 68 simultaneously. In this embodiment, two non-processed substrates 2 (2a) can be held on upper two stage supporting pins 70 whereas processed substrates 2 (2b) can be processed on lower two stage supporting pins 70. On the periphery of each holder 32, as shown in FIG. 4, four notches 33 through which the above supporting pins 70 pass are formed.

Although described later in detail, in cooperation with the holder moving mechanism described above, i.e. by moving the poles 68 vertically in a direction of arrows (1) and (3) or (5) and (7) in FIGS. 7B to 7C in a prescribed relation with moving the two holders 32 to-and-from in the above arrow B indicated by arrows (2) and (6) in FIGS. 7B to 7C, the above substrate replacing mechanism 66, can take out two processed substrates 2b simultaneously and mount two non-processed substrates 2a simultaneously within the vacuum spare chamber 62.

The reciprocating linear movement of the two holders 32 indicated by the above arrow B, change of the profile thereof indicated by the arrow C and ascend/descent of the above substrate replacing mechanism 66 can be controlled actually in such a manner that the two motors 46 and 50 and the drive mechanism can be controlled by the control device. The control device 60 also serves to control the pulling out of the ion beam 56 from the ion source 54 and the substrate processing method described above with reference to FIGS. 9A to 9B.

This substrate processing device has only to include two vacuum vessels, i.e. processing chamber 30 and a vacuum spare chamber 62.

In addition, the holder moving mechanism 34 permits the two holders 32 to make the reciprocating linear movement independent from each other so as to traverse the processing position P within the processing chamber 30, thereby subjecting the substrate 2 held in each holder 32 to ion implantation. Further, the same holder moving mechanism 34 permits the two holders 32 each holding the substrate to make the reciprocating linear movement between the processing chamber 30 and the vacuum spare chamber 62, thereby transferring the substrates between both chambers. For this reason, unlike the conventional art shown in FIG. 10, provision of the transfer robot 18 dedicated to substrate transfer in the vacuum is not required. In the conventional art shown in FIG. 10, although the transfer robot was required separately from the holder driving mechanism 6, in the present invention 18 is not required, thus simplifying the mechanism of the substrate transfer in the vacuum.

Thus, in the substrate processing apparatus according to this embodiment, only two vacuum vessels are required, and the mechanism of the substrate transfer in the vacuum is simplified so that the apparatus configuration can be simplified.

Further, into the vacuum spare chamber 62, the two holders 32 with the substrates 2 held can be moved simultaneously by the holder moving mechanism 34, and in the vacuum spare chamber 62, the substrates can be simultaneously replaced for the two holders 32 from the processed substrates 2b to the non-processed substrates 2a and vice versa in cooperation of the holder moving mechanism 34 and the substrate replacing mechanism 66. Therefore, as compared with the case where substrate replacement between the processed substrates and non-processed substrates is carried out one by one as in the conventional art shown in FIG. 10, the number of times of substrate transfer, substrate replacement and vacuum evacuation of the vacuum spare chamber can be reduced so that the throughput of the apparatus can be improved.

Specifically, since simultaneous replacement of the two substrates 2 can be made, the time required for replacement of one sheet of substrate can be reduced to half. Thus, the entire time required for the substrate processing can be reduced to this degree so that the throughput of the apparatus can be improved. Otherwise, in place of improving the throughput, to the degree of the replacing time shortened, the time which can be taken for the actual processing of the substrate can be lengthened. In this case, since the incident power per unit time by the ion beam to the substrate 2 can be suppressed, a temperature increase of the substrate 2 during the processing can be also suppressed.

Figure 10:
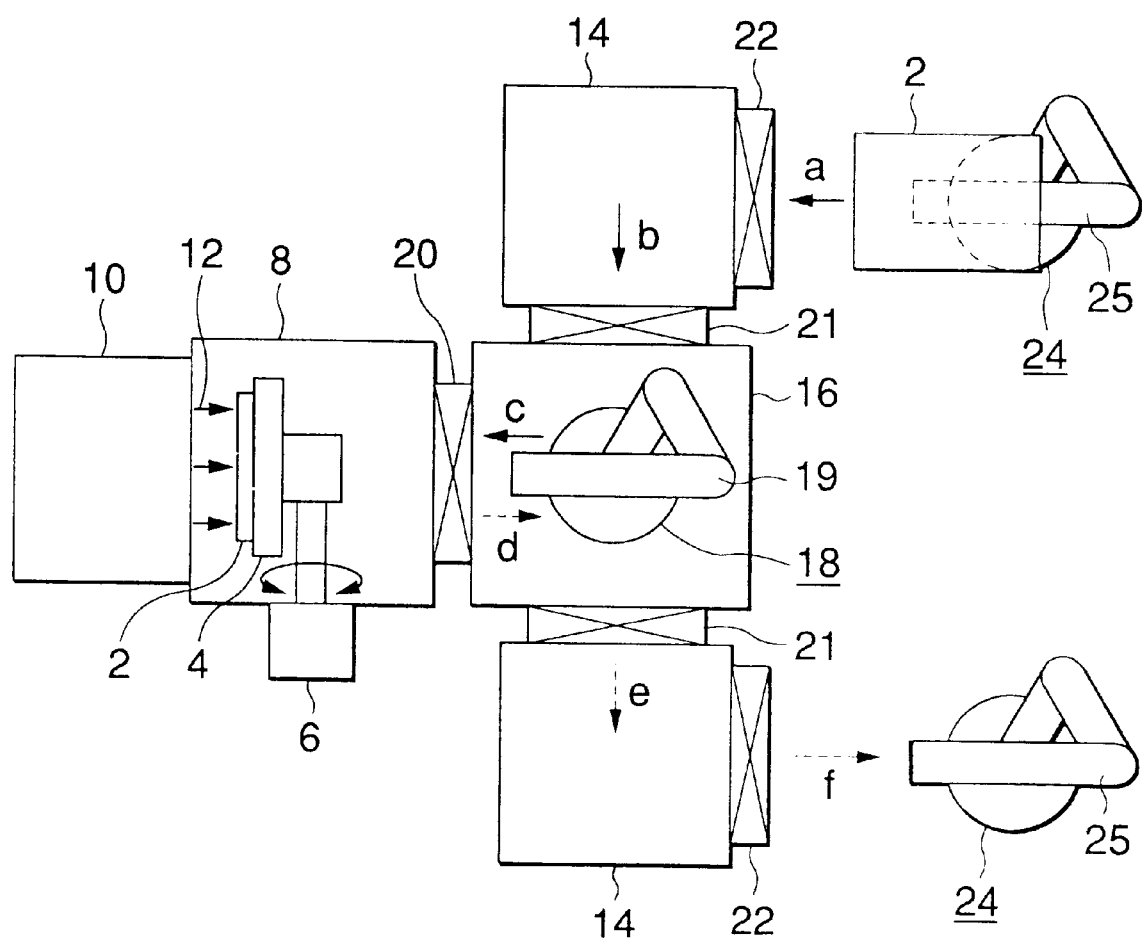
FIG. 10 is a schematic plan view showing an example of a conventional substrate processing apparatus.

Since the substrate replacing mechanism 66 serves to make the substrate replacement in cooperation with the holder moving mechanism 34, it may be more simple and smaller than the transfer robot 18 according to the conventional art shown in FIG. 10. Thus, the volume of the vacuum spare chamber 62 can be reduced, and because of its simple mechanism, the vacuum evacuation of the environment can be easily done. Accordingly, the vacuum evacuation time of the vacuum spare chamber 62 can be shortened. For this reason also, the throughput of the apparatus can be improved.

For example, the vertical interval between the supporting pins 70 may be 20–30 mm. Also in the case where four stages of supporting pins 70 are provided as in the above embodiment and the interval between the inner wall of the chamber and the supporting pin is 10 mm, the internal height of the vacuum spare chamber 62 may be very small, e.g. 100–150 mm. For this reason, the volume of the vacuum spare chamber 62 can be reduced.

However, in the case of the conventional one having two stages of supporting pins, if the vertical interval between the supporting member pins 70 and he interval between the inner wall of the chamber and the supporting pin are set to equivalent to the present embodiment, the internal height of the vacuum spare chamber is 60 to 80 mm. However, since two spare chambers are necessary in the conventional one, the total height of the spare chamber is 120 to 160 mm. Accordingly, the present invention can reduce the volume of the vacuum spare chamber in comparison with the conventional one.

Kohyo Tokkyo Kouhou (Publication) Hei. 4-502534 discloses an apparatus in which two holders (supports) each holding a substrate are moved alongside simultaneously in directions opposite to each other in front of the processing position by a common driving belt. However, this publication does not disclose (1) arranging a vacuum spare chamber adjacently to this processing chamber; (2) a mechanism of transferring the substrate between the processing chamber and the vacuum spare chamber; and (3) a mechanism for replacing a processed substrate and non-processed substrate with each other for the above two holders.

Since the above driving belt cannot move the holder outside the processing chamber, even when the vacuum spare chamber is provided, the transfer robot as described above has to be generally arranged therein. Such a configuration gives the same problem as in the conventional art of FIG. 10.

Returning to the description of the embodiment of the present invention again, as clearly seen from FIG. 2, the arms 36 which are supports for the holders 32 are preferably provided behind the holders 32 so as to project slightly backward therefrom. In such a configuration, as seen from FIG. 3, when the holders are inserted into the vacuum spare chamber 62, the arms 36 do not hit the vacuum valve 64 so that an increase in the width of the vacuum valve 64 is not required. The width W may have actually a size which permits the holder 32 holding the substrate 2 to pass.

Figure 5:
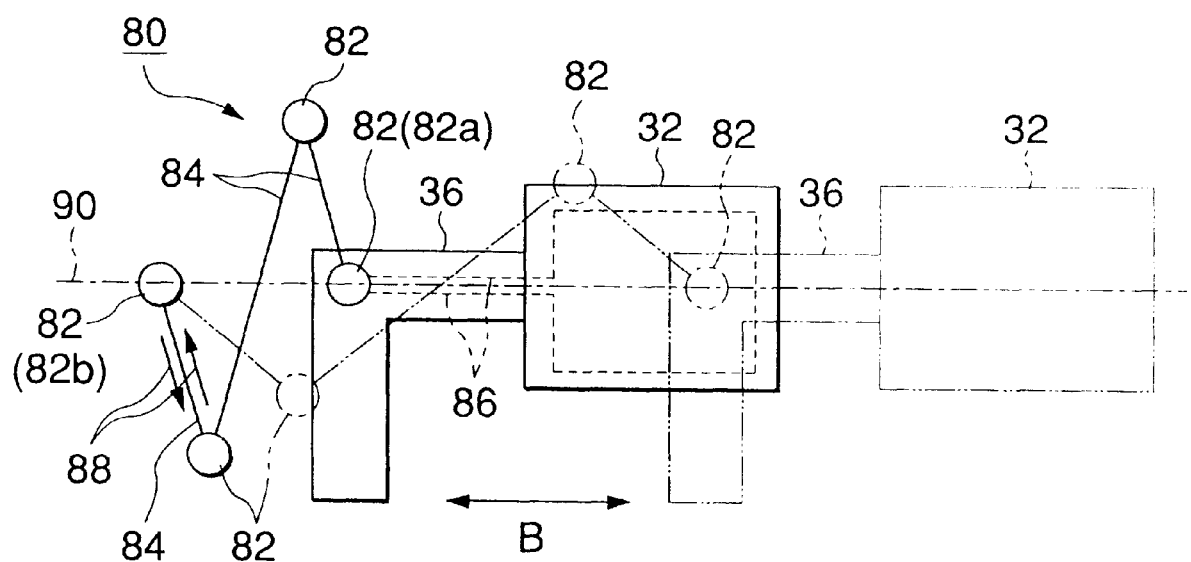
FIG. 5 is a schematic side view showing an example of a cooling mechanism.

The holders 32, whose temperature increases owing to the processing of ion-implantation for the substrate 2, is preferably cooled by provision of a cooling mechanism. An embodiment for cooling it is shown in FIG. 5. The cooling temperature of the holders 32 is 170° C. or less, but that of the conventional one is 200° C. or more.

In FIG. 5, a cooling mechanism 80 includes four rotary joints 82 and three conduits 84 for connecting them. These components constitute a reciprocating flow path of refrigerant 86. A refrigerant such as water is passed through the arm 36 and holder 32 from the outside of the processing chamber 30 so that the holder 32 and the arm 36 in this embodiment can be cooled.

More specifically, a tip joint 82 (82a) is attached to the arm 36 in the neighborhood of a center axis 90 of the holder 32. A root joint 82 (82b) is attached to the supporting section 42. The root joint 82b may be directly attached to the supporting section 42, or may be attached to be located in the neighborhood of the holder 32 as shown in FIG. 5 through a supporting post having a refrigerant path provided between the supporting section 42 and the joint 82. The two intermediate joints 82 are not fixed so as to be freely movable horizontally and vertically. Thus, in the cooling mechanism 80, the joints 82 can expand or contract as indicated by solid-line and two-dot-chain line in FIG. 5 in accordance with the parallel movement of the holders 32.

These cooling mechanisms 80 are provided, one for each holder 32, on the opposite sides to each other so that they do not collide with each other and the distance between the two holders 32 can be made as short as possible. Specifically, for the holder 32 on the side near to the ion source 54, the one cooling mechanism 80 is attached to its surface on the side near to the ion source 54, whereas for the holder 32 on the opposite side, the other cooling mechanism 80 is attached to its surface on the opposite side. Thus, the two cooling mechanisms are arranged symmetrically with respect to the inside and outside of the holders 32.

Provision of these cooling mechanism 80 permits the holder 32 to be cooled. This realizes (1) to prevent thermal deformation of the holder 32; (2) to prevent attenuation of the vacuum degree in the processing chamber 30 by means of suppression of the gas discharge (out-gas) from the holder 32; and (3) prevention to prevent the deformation of the substrate 2 by means of suppression of the temperature increase during the processing of the substrate 2.

Although there is an idea of using a flexible tube of synthetic resin or metal in place of the cooling mechanism 80, the tube of synthetic resin cannot be actually used because it gives a large quantity of discharged gas in the vacuum and the metallic tube cannot be used because it is susceptible to repetitive fatigue.

As in this embodiment, it is more preferable to cool the arm 36 by flow of the refrigerant therethrough because the thermal deformation of the arm 36 can be prevented and the gas discharge from the arm 36 can be suppressed.

As in this embodiment, at least the tip joint 82a is attached in the neighborhood of the center axis 90 of the holder 32. Accordingly, when the cooling mechanism 80 contracts, the intermediate joints 82 and conduits 84 project vertically by substantially the same degree from the center axis 90. Therefore, decreases the height of the processing chamber to prevent redundant increase in the volume of the processing chamber 30 as compared with the case where only either one of them projects largely.

Referring to FIG. 1 again, in this embodiment, the rotating mechanism composed of the motor 50, etc. is provided for rotating the holder moving mechanism 34 as indicated by the arrow C described above. Accordingly, the substrate 2 can be processed in an upright condition of the holder 32 so that application of dust on the processing surface of the substrate 3 during processing can be prevented. In addition, since the substrate replacement is performed in a horizontal condition of the holder 32, it can be easily carried out, thus simplifying the structure of the substrate replacing mechanism 66.

In this embodiment, the holders 32 holding the substrates in parallel reciprocates over the processing position P and gives the ion beam 56 projected from the ion source 54 in a band shape as shown in FIG. 2. Therefore, the entire surface of the substrate 2 can be uniformly irradiated with the ion beam 56, thereby processing the substrates uniformly without scanning the ion beam electrically (i.e. by electric field or magnetic field) or giving a large area of the ion beam enough to surround the entire substrate 2, the entire surface of the substrate 2 can be uniformly irradiated with the ion beam 56, thereby processing the substrates uniformly.

The substrate 2 can be processed in such a manner that it is moved unidirectionally once (in parallel movement) to be completely subjected to necessary processing, and thereafter, likewise, a subsequent substrate 2 is moved unidirectionally to be completely subjected to the necessary processing. However, the substrate 2 is preferably processed by the following processing method.

Figures 9A, 9B:
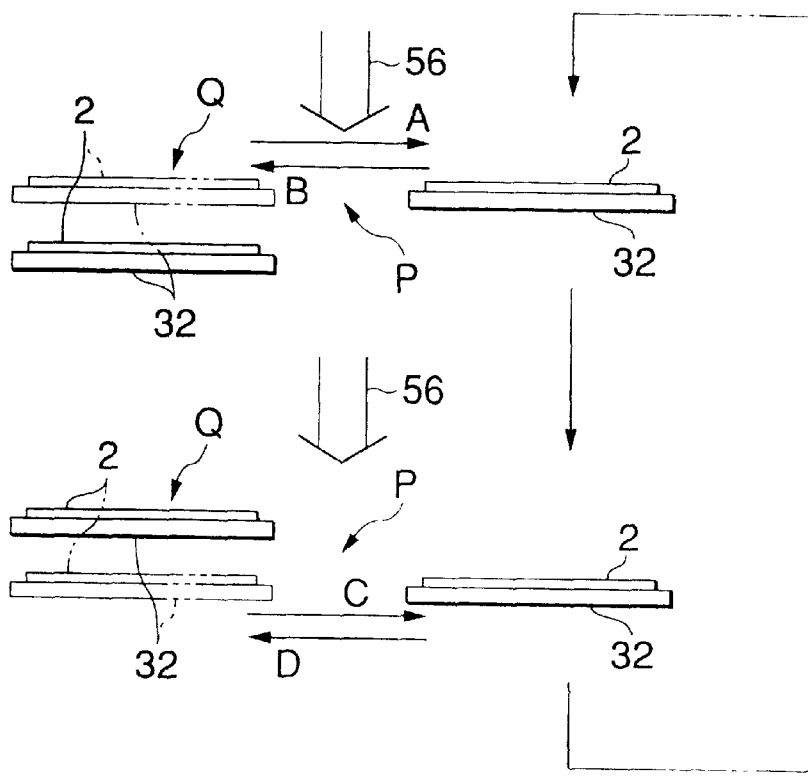
FIGS. 9A to 9B is a process view showing an example of the substrate processing method according to the present invention.

As seen from FIGS. 9A to 9B, the one holder 32 holding the substrate 2 is caused to shuttle once over the processing position P as indicated by arrows (a) and (b) during which the substrate 2 is irradiated with the ion beam 56 so as to be subjected to ion implantation. The other holder rests on a stand-by position Q to which the ion beam 56 is not incident (FIG. 9A). In FIG. 9A, although the one holder 32 is one located on the side near to the ion source 54, the holder 32 on the opposite side may be used.

Next, the other holder 32 holding the substrate 2 is caused to shuttle once over the processing position P as indicated by arrows (c) and (d) during which the substrate 2 is irradiated with the ion beam 56 so as to be subjected to ion implantation. The one holder on the side near to the ion source 54 rests on the stand-by position Q (FIG. 9B). This intends to prevent the corresponding arm 36 (see FIG. 2) from obstructing the ion beam 56.

A series of processing steps shown in FIGS. 9A and 9B are repeated once or plural times so that each substrate will be subjected to a necessary quantity of processing.

According to such a processing method, a single sheet of substrate 2 can be processed at least twice in such a manner that it is irradiated with the ion beam 56 in at least two steps (once on the going path and once on the return path). Therefore, this method can suppress an increase in the temperature of the substrate 2 as compared with the case where the substrate 2 is completely subjected to a necessary quantity of processing in one step. This is because reduction of the substrate temperature can be expected between steps of processing. Further, even if a change occur in the beam current of the ion beam 56 during the processing, the processing divided in two or more steps is less susceptible to the change than a necessary quantity of processing in one step is. Thus, attenuation in the evenness of the substrate processing can be suppressed.

The repetition number of times of a series of processing steps shown in FIGS. 9A and 9B depends on the necessary quantity of processing (e.g. quantity of ion implantation), the beam current of the ion beam 56, etc. To perform it at plural number of times is more preferable than to perform it once because the above effect is made more excellent. However, an excessively large number of times of the series of processing steps lengthens the time required for processing to reduce the throughput so that ten or less times of the process, concretely 2 to 6 times thereof is preferable.

Figure 7A:
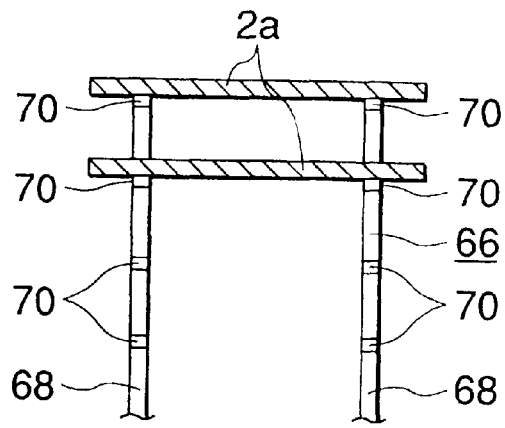
FIGS. 7A to 7C are views showing an example of the operation of replacing a substrate for a holder in a vacuum spare chamber, and taken along line X—X in FIG. 1.
Figure 7B:
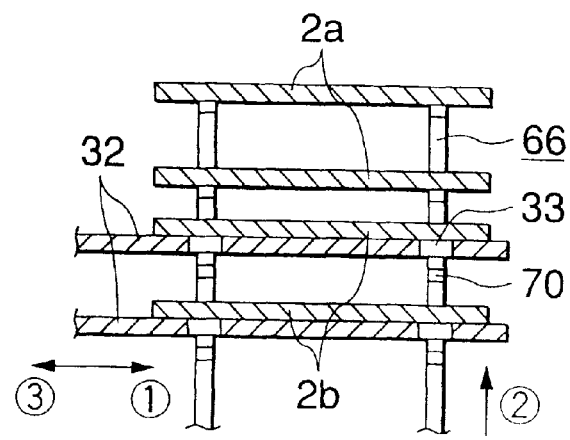
Figure 7C:
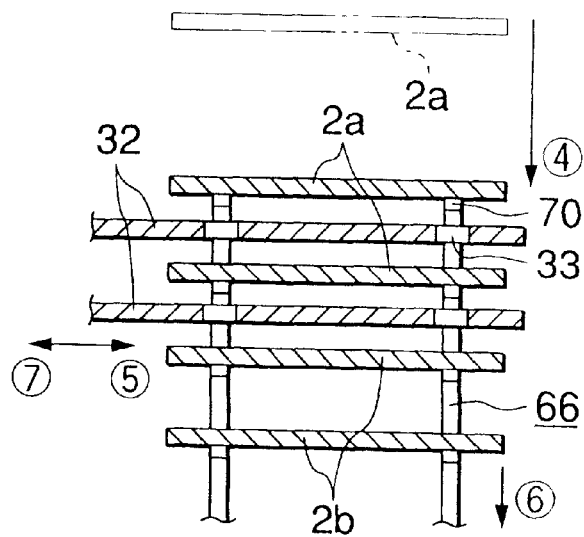

Referring to FIGS. 7A to 7C, an explanation will be given of the details of the method of replacing the processed substrates and the non-substrates with each other collectively for the two holders 32 within the vacuum spare chamber 62.

As shown in FIG. 7A, it is assumed that two non-processed substrates 2a are already placed on the upper two stages of pins 70 of the substrate replacing mechanism 66 (this will be described later with reference to FIGS. 8A to 8C).

As seen from FIG. 7B, the two holders 32 each holding the processed substrate 2b are inserted over the lower two stages of supporting pins 70, and as indicated by arrow (2), the substrate replacing mechanism 66 (the column 68 and supporting pin 70, hereinafter also referred to) are lifted so that the two processed substrates 2b is lifted by the lower two stages of supporting pins 70 (then, the supporting pins 70 pass the notches 33 of the holders 32). Then, both holders 32 are simultaneously pulled out as indicated by arrow (3).

As seen from FIG. 7C, as indicated by arrow (4), the substrate replacing mechanism 66 is lowered by two stages, and the two holders 32 are inserted again below the upper two stages of supporting pins 70 as indicated by arrow (5). The substrate replacing mechanism 66 is further lowered as indicated by arrow (6) and the non-processed substrates 2a on the upper two stages of supporting pins 70 are placed on the respective holders 32 (then the supporting pins 70 pass the notches 33 of the holders 32). Then, both holders 32 are pulled out simultaneously as indicated by arrow (7).

Thus, the replacement of the substrates is completed.

Now referring to FIGS. 8A to 8C, an explanation will be given of the details of the method for executing the transfer in/out of the processed substrates and the non-processed substrates between the inside of the vacuum spare 62 and the air. One or two arms 74 of the transfer robot on the side of the air may be used. However, it is now assumed that the transfer robot is equipped with a single arm.

Figure 8A:
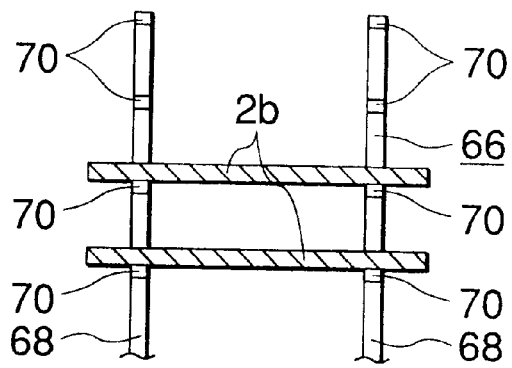
FIGS. 8A to 8C are views showing an example of the operation of replacing a substrate from the air side for the substrate replacing mechanism in a vacuum spare chamber, and taken along line X—X in FIG. 1.

As seen from FIG. 8A, it is assumed that the two processed substrates 2b are already placed on the lower two stages of supporting pins of the substrate replacing mechanism 66 by the above operation shown in connection with FIGS. 7A to 7C.

Figure 8B:
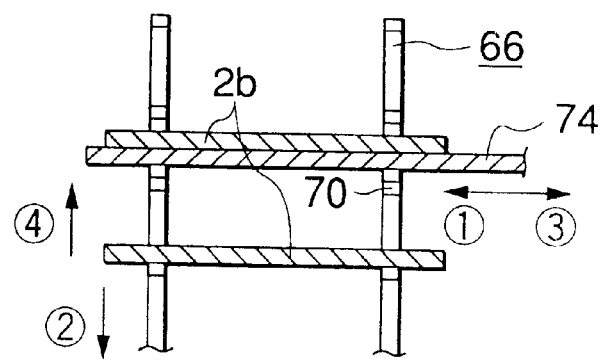

As seen from FIG. 8B, as indicated by arrow (1), the arm of the aforesaid transfer robot on the side of air is inserted over the third stage of supporting pin 70 from top and the substrate replacing mechanism 66 is lowered as indicated by arrow (2) (then, the arm 74 does not collide with the supporting pins 70 since its width is smaller than the distance between the opposite supporting pins 70 as shown in FIG. 1). The arm on which the substrate 74 is placed is pulled out as indicated by arrow (3). Thus, the processed substrate 2b is transferred out into the air.

In the case of the single arm as in this embodiment, the substrate replacing mechanism 66 is lifted by one stage as indicated by arrow (4). Thereafter, in the same manner as described above, the processed substrate on the lower stage will be transferred out into the air.

Figure 8C:
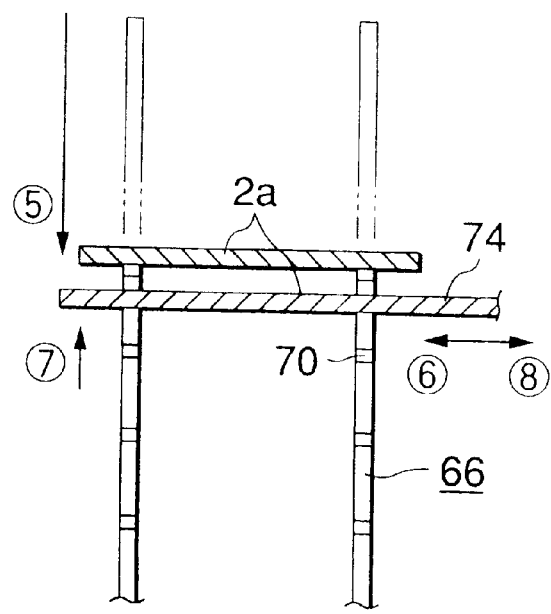

As seen from FIG. 8C, the substrate replacing mechanism 66 which has become vacant entirely is lowered by two stages as indicated by arrow (5). The arm 74 on which the non-processed substrate 2a is placed is inserted over the uppermost supporting pin 70. As indicated by arrow (7), the substrate replacing mechanism 66 is lifted so that the supporting pins accept the non-processed substrate 2a from the arm 74. The arm 74 is thereafter pulled out as indicated by arrow (8). Likewise, the non-processed substrate 2a will be also placed on the supporting pins 70 on the second stage from top.

Thus, the replacement of the substrate will be completed.

The number of the holders 32 may be three or more. In this case, the holder moving mechanism 34 and substrate replacing mechanism 66 will be correspondingly designed. However, the larger number of the holders becomes, the higher the substrate replacing mechanism 66 and hence the vacuum spare chamber 62 become, thereby increasing the volume thereof. Thus, the vacuum evacuation time for the vacuum spare chamber is lengthened. From this point of view, the number of the holders is desired to be up to three, i.e. two or three.

As the unit for processing the substrate 2, a film depositing unit such as an arc type evaporation source may be provided in place of or in addition to the ion source. Alternatively, an plasma creating device may be provided to subject the substrate 2 to the plasma processing such as plasma CVD.

Further, without providing the rotary mechanism composed of the motor 50 for rotating the holder moving mechanism 34, the processing and replacement for the holder 32 may be done with the holder 32 being held.

The present invention, which is configured as described above, provides the following effects.

In accordance with the invention, only two vacuum vessels are required and a mechanism for transferring a substrate is also simplified so that the apparatus arrangement can be simplified. In addition, the number of times of substrate transfer, substrate replacement and vacuum evacuation for the vacuum spare chamber can be reduced, and the volume of the vacuum spare chamber can be reduced to shorten the vacuum time so that the throughput of the apparatus can be improved.

In addition, since each of the holders can be cooled by a cooling mechanism, thermal deformation of the holders, attenuation of the vacuum degree within the processing chamber based on suppressing the gas discharge from the holder and deterioration of the substrate based on suppressing the temperature increase during substrate processing can be prevented.

Further, since the substrate can be processed in an upright condition of the holder, application of dust on the processing surface of the substrate in processing can be prevented. In addition, since replacement of the substrate can be done in a horizontal condition, it can be easily performed and the structure of the substrate replacing mechanism can be simplified.

Furthermore, since the entire surface of the substrate is uniformly irradiated with ion beams without scanning ion beams by an electric field or magnetic field or using the ion beam having a large area enough to surround the entire substrate, the substrate can be processed uniformly.

Moreover, since a single sheet of substrate can be processed divisionally in at least two steps, the temperature increase of the substrate can be reduced as compared with the case where the substrate is subjected to a necessary quantity of processing in one step. Further, even if a change occurs in the processing device while the substrate is processed, the influence by the change can be decreased as compared with the case where the substrate is subjected to a necessary quantity of processing in one step so that attenuation of uniformness of the substrate processing can be relaxed.

What is claimed is:

1. A substrate processing apparatus comprising:
a processing chamber evacuated to vacuum for processing substrates;
a plurality of holders arranged substantially in parallel to one another within said processing chamber, each for holding a substrate on a surface thereof on the same side;
processing means for successively processing the substrates held in the respective holders at a prescribed position in said processing chamber;
a vacuum spare chamber provided adjacent to said processing chamber;
a vacuum valve intervening between said vacuum spare chamber and said processing chamber to permit said plurality of holders holding the substrates to be passed collectively;
a holder moving mechanism for performing the operation of the reciprocating movement of said plurality of holders independently from one another within said processing chamber so that said plurality of holders traverse the processing position, and the reciprocating movement of said plurality of holders simultaneously between the insides of said processing chamber and vacuum spare chamber through said vacuum valve;

a substrate replacing mechanism provided within said vacuum spare chamber capable of holding non-processed substrates and processed substrates whose number is equal to that of said holders, and serving to replace the processed substrates and non-processed substrates with each other collectively for said plurality of holders moved into said vacuum spare chamber in cooperation with the holder moving mechanism; and a rotary mechanism for rotating said holder moving mechanism so that said plurality of holders employ their profiles in an upright condition or a substantially horizontal condition within said processing chamber;

wherein said processing means serves to process the substrate held in each of said holders in the upright condition, said vacuum valve serves to pass the holders in the substantially horizontal condition, and said substrate replacing mechanism serves to make replacement of the substrates for the holders in the substantially horizontal condition.

2. A substrate processing apparatus according to claim 1, further comprising cooling means for cooling said holder.

3. A substrate processing apparatus according to claim 2, wherein said cooling means comprises a plurality of cooling mechanisms each constituting a reciprocating flow path of refrigerant by a plurality of rotary joints and conduits for coupling said rotary joints, and capable of passing the refrigerant through each holder via said flow path.

4. A substrate processing apparatus according to claim 1, wherein said processing means is an ion source for emitting an ion beam which is lengthy in a direction substantially orthogonal to the moving direction of said holders within said processing chamber and longer than the length of each of the substrates in said orthogonal direction.

5. A substrate processing method for processing substrates using a substrate processing apparatus comprising:

a processing chamber evacuated to vacuum for processing substrates; a plurality of holders arranged substantially in parallel to one another within said processing chamber, each for holding a substrate on a surface thereof on the same side; processing means for successively processing the substrates held in the respective holders at a prescribed position in said processing chamber; a vacuum spare chamber provided adjacent to said processing chamber; a vacuum valve intervening between said vacuum spare chamber and said processing chamber to permit said plurality of holders holding the substrates to be passed collectively; a holder moving mechanism for performing the operation of the reciprocating movement of said plurality of holders independently from one another within said processing chamber so that said plurality of holders traverse the processing position, and the reciprocating movement of said plurality of holders simultaneously between the insides of said processing chamber and vacuum spare chamber through said vacuum valve; a substrate replacing mechanism provided within said vacuum spare chamber capable of holding non-processed substrates and processed substrates whose number is equal to that of said holders, and serving to replace the processed substrates and non-processed substrates with each other collectively for said plurality of holders moved into said vacuum spare chamber in cooperation with the holder moving mechanism; and a rotary mechanism for rotating said holder moving mechanism so that said plurality of holders employ their profiles in an upright condition or a substantially horizontal condition within said processing chamber;

wherein said processing means serves to process the substrate held in each of said holders in the upright condition, said vacuum valve serves to pass the holders in the substantially horizontal condition, and said substrate replacing mechanism serves to make replacement of the substrates for the holders in the substantially horizontal condition;

said method comprising the steps of:

reciprocating one of said plurality of holders each holding said substrate once over the processing position to process the substrate by said processing means; and during said reciprocating step, resting the remaining holders each holding the substrate at a stand-by position where the substrate is not processed;

wherein said reciprocating step and resting step are subjected successively to said plurality of holders, and a series of said successive process to said plurality of holders are repeated at least one time.

6. A substrate processing apparatus according to claim 5, further comprising cooling means for cooling said holder.

7. A substrate processing apparatus according to claim 6, wherein said cooling means comprises a plurality of cooling mechanisms each constituting a reciprocating flow path of refrigerant by a plurality of rotary joints and conduits for coupling said rotary joints, and capable of passing the refrigerant through each holder via said flow path.

8. A substrate processing apparatus according to claim 5, wherein said processing means is an ion source for emitting an ion beam which is lengthy in a direction substantially orthogonal to the moving direction of said holders within said processing chamber and longer than the length of each of the substrates in said orthogonal direction.

* * * * *